(12) United States Patent
Jose et al.

(10) Patent No.: US 11,640,377 B2
(45) Date of Patent: May 2, 2023

(54) EVENT-BASED GENERATION OF CONTEXT-AWARE TELEMETRY REPORTS

(71) Applicant: Dell Products, L.P., Round Rock, TX (US)

(72) Inventors: Cyril Jose, Austin, TX (US); Choudary Maddukuri, Austin, TX (US); Sankara Rao Gara, Cedar Park, TX (US); Sankunny Jayaprasad, Round Rock, TX (US); Sailaja Mahendrakar, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 272 days.

(21) Appl. No.: 16/931,166

(22) Filed: Jul. 16, 2020

(65) Prior Publication Data

US 2022/0019561 A1 Jan. 20, 2022

(51) Int. Cl.
*G06F 16/21* (2019.01)
*G05B 19/406* (2006.01)

(52) U.S. Cl.
CPC .......... *G06F 16/21* (2019.01); *G05B 19/406* (2013.01); *G05B 2219/50333* (2013.01)

(58) Field of Classification Search
CPC .... G06F 16/1827; G06F 16/217; G06F 16/21; G06F 1/206; G06F 1/3206; G05B 19/406; G05B 2219/50333; H05K 7/20836; H05K 7/1498
See application file for complete search history.

(56) References Cited

U.S. PATENT DOCUMENTS

| | | | | |
|---|---|---|---|---|
| 2014/0064258 | A1* | 3/2014 | Montag | H04W 84/12 370/338 |
| 2014/0280804 | A1* | 9/2014 | Thodati | H04L 41/0806 709/222 |
| 2016/0249223 | A1* | 8/2016 | Egner | H04W 16/14 |
| 2017/0257303 | A1* | 9/2017 | Boyapalle | H04L 67/1002 |
| 2018/0027063 | A1* | 1/2018 | Nachimuthu | H03M 7/4081 709/226 |

* cited by examiner

*Primary Examiner* — Cindy Nguyen
(74) *Attorney, Agent, or Firm* — Fogarty LLP

(57) ABSTRACT

Systems and methods utilize telemetry data to provide administrators with metric information related to a detected IHS (Information Handling System) event, such as an error condition, where the provided metric information is particularized to the context of the event. A remote access controller (RAC) of the IHS stores metric reports received from metric sources. The RAC receives an indication of the event that specifies a first IHS component as a source of the event and specifies a time associated with the event. The RAC identifies stored metric reports generated by the first component prior to the first time and identifies stored metric reports generated by components that are logically and/o physically related to the first component. The RAC generates an event report that includes the metric reports generated by the first component prior to the first time and the metric reports generated by components related to the first component.

20 Claims, 3 Drawing Sheets

EVENT-BASED GENERATION OF CONTEXT-AWARE TELEMETRY REPORTS

FIELD

The present disclosure generally relates to Information Handling Systems (IHSs), and, more particularly, to telemetry systems used by IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use, such as financial transaction processing, airline reservations, enterprise data storage, or global communications. In addition, IHSs may include a variety of hardware and software components that may be configured to process, store, and communicate information and may include one or more computer systems, data storage systems, and networking systems.

The operation of an IHS may be characterized by metrics that provide a measurable aspect of the IHS's operation. For instance, an IHS metric may provide environmental sensor readings, such a temperature sensor measurement, or an operational sensor reading, such as the amps being drawn by a component of the IHS. An IHS metric may also provide discrete information, such as the operational state of a component. An IHS metric may also provide a logical rather than physical sensor measurement, such as a digital counter sensor measuring the amount of data transferred by a networking component of the IHS. An IHS may utilize a telemetry system in order to configure and manage the collection of metric reports from various sources of metric data within the IHS. Using the metric data collected by a telemetry system, the operation of an IHS may be monitored and managed remotely. For example, based on readings collected from temperature sensors, failure conditions in a cooling system can be identified and the operation of the cooling system may be adjusted in order to compensate for the failure condition, thus avoiding damage to the IHS. In a data center environment, rack-mounted server IHSs may utilize telemetry systems that support the collection of metric data from a variety of different sources. Administrators may utilize the data collected by such telemetry systems in diagnosing errors or other events of interest related to an IHS.

SUMMARY

In various embodiments, IHSs (Information Handling Systems) are provided that may include: a plurality of sources of metric data; and a remote access controller providing remote management of the IHS, wherein the remote access controller is configured to: store metric reports received from the plurality of metric data sources; receive an indication of an IHS event, wherein the indication specifies a first component of the IHS as a source of the event and wherein the indication specifies a first time associated with the event; identify a first plurality of the stored metric reports generated by the first component prior to the first time; identify a second plurality of stored metric reports generated by components related to the first component; and generate an event report comprising the first plurality of the metric reports generated by the first component prior to the first time and the second plurality of metric reports generated by components related to the first component.

In additional IHS embodiments, the components related to the first component are determined based on physical proximity to the first component. In additional IHS embodiments, the physical proximity is determined based on a proximity from a coupling of the first component to the IHS. In additional IHS embodiments, the components related to the first component are located in bays of the IHS that are adjacent to a bay in which the first component is located. In additional IHS embodiments, the first component is coupled to the IHS via a first connector and wherein the components related to the first component are coupled to connectors that are adjacent to the first connector. In additional IHS embodiments, the IHS event is an error condition. In additional IHS embodiments, the components related to the first component are determined based on a logical relationship to the first component. In additional IHS embodiments, the logical relationship comprises management of the first component by the related components. In additional IHS embodiments, the plurality of metric reports generated by the first component prior to the first time are generated within a predefined interval prior to the first time associated with the event.

In various additional embodiments, methods are provided for diagnostic IHS (Information Handling System) telemetry. The methods may include: storing metric data reports received from a plurality of components of the IHS; receiving an indication of an IHS event; identifying a first component of the IHS as a source of the event and a first time associated with the event; identifying a plurality of the stored metric reports generated by the first component prior to the first time; identifying a plurality of the stored metric reports generated by components related to the first component; and generating an event report comprising the plurality of the metric reports generated by the first component prior to the first time and the plurality of metric reports generated by components related to the first component.

In additional method embodiments, the components related to the first component are determined based on physical proximity to the first component. In additional method embodiments, the first component is coupled to the IHS via a first connector and wherein the components related to the first component are coupled to connectors that are adjacent to the first connector. In additional method embodiments, the IHS event is an error condition. In additional method embodiments, the components related to the first component are determined based on a logical relationship to the first component. In additional method embodiments, the logical relationship comprises management of the first component by the related components. In additional method embodiments, the plurality of metric reports generated by the first component prior to the first time are generated within a predefined interval prior to the first time associated with the event.

In various additional embodiments, remote access controllers provide diagnostic IHS (Information Handling System) telemetry. The remote access controllers may include: one or more processors; and a memory device coupled to the one or more processors, the memory device storing computer-readable instructions that, upon execution by the one or more processors, cause the remote access controllers to: store metric data reports received from a plurality of components of the IHS; receive an indication of an IHS event, wherein the indication specifies a first component of the IHS as a source of the event and wherein the indication specifies a first time associated with the event; identify a plurality of the metric reports generated by the first component prior to the first time; identify a plurality of metric reports generated by components related to the first component; and generate an event report comprising the plurality of the metric reports generated by the first component prior to the first time and the plurality of metric reports generated by components related to the first component.

In additional remote access controller embodiments, the components related to the first component are determined based on physical proximity to the first component. In additional remote access controller embodiments, the components related to the first component are determined based on a logical relationship to the first component. In additional remote access controller embodiments, the IHS event is an error condition.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
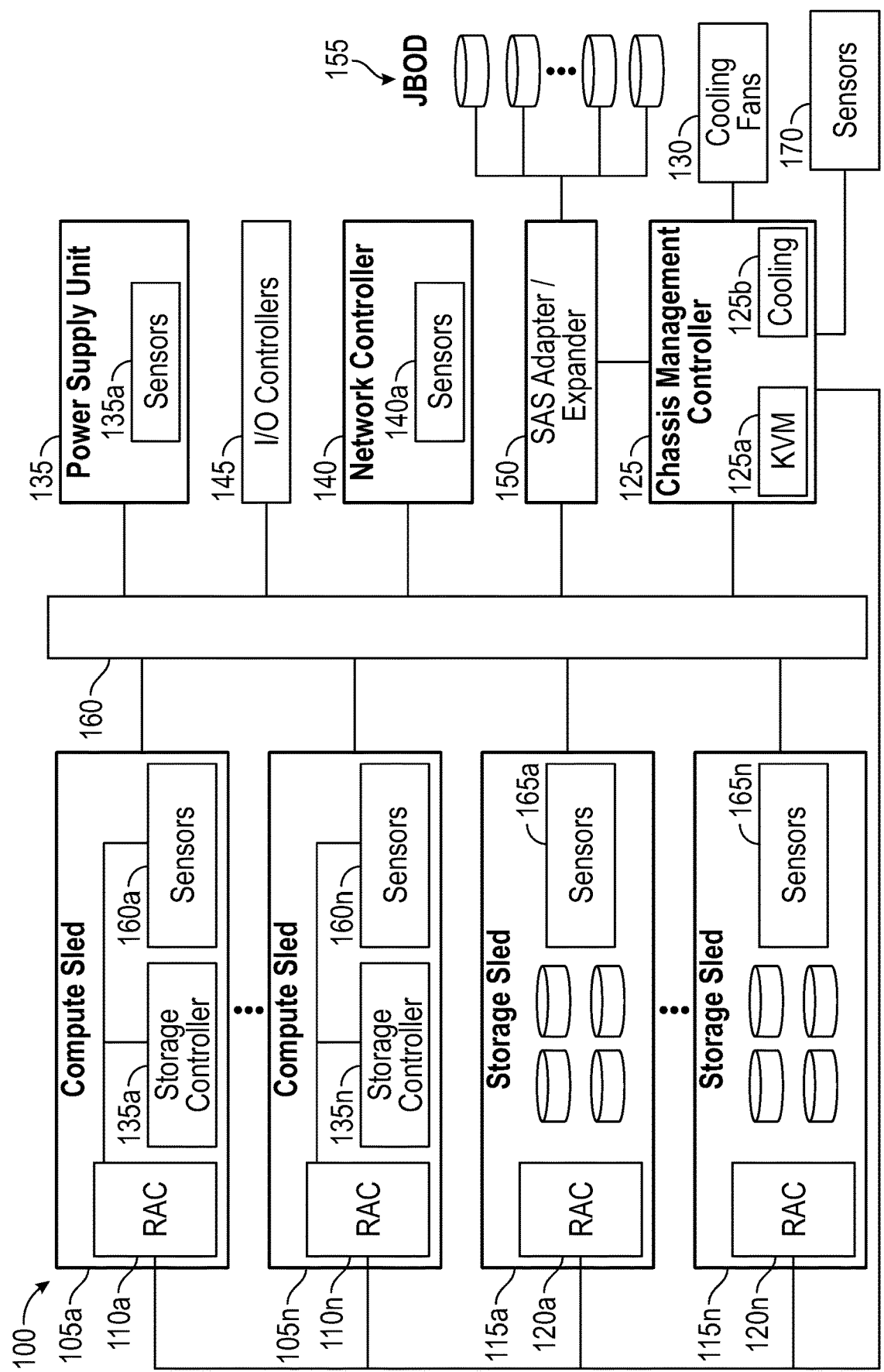
FIG. 1 is a diagram illustrating certain components of a chassis, according to some embodiments, for event-based generation of context-aware telemetry reports.

FIG. 1 is a block diagram illustrating certain components of a chassis 100 comprising one or more compute sleds 105a-n and one or more storage sleds 115a-n that may be configured to implement the systems and methods described herein for event-based generation of context-aware telemetry reports. Chassis 100 may include one or more bays that each receive an individual sled (that may be additionally or alternatively referred to as a tray, blade, server, drive and/or node), such as compute sleds 105a-n and storage sleds 115a-n. Chassis 100 may support a variety of different numbers (e.g., 4, 8, 16, 32), sizes (e.g., single-width, double-width) and physical configurations of bays. Other embodiments may include additional types of sleds that provide various types of storage and/or processing capabilities. Other types of sleds may provide power management and networking functions. Sleds may be individually installed and removed from the chassis 100, thus allowing the computing and storage capabilities of a chassis to be reconfigured by swapping the sleds with different types of sleds, in many cases without affecting the ongoing operations of the other sleds installed in the chassis 100.

Multiple chassis 100 are typically housed within a rack, with each chassis installed in one or more slots of the rack. Data centers may utilize large numbers of racks, with various different types of chassis installed in the various rack configurations. The modular architecture provided by the sleds, chassis and rack allow for certain resources, such as cooling, power and network bandwidth, to be shared by the compute sleds 105a-n and storage sleds 115a-n, thus providing efficiency and supporting various types of computational loads.

Chassis 100 may be installed within a rack that provides all or part of the cooling utilized by chassis 100. For airflow cooling, a rack may include one or more banks of cooling fans that may be operated to ventilate heated air from within the chassis 100 that is housed within the rack. The chassis 100 may alternatively or additionally include one or more cooling fans 130 that may be similarly operated to ventilate heated air from within the sleds 105a-n, 115a-n that are installed within the chassis. A rack and a chassis 100 installed within the rack may utilize various configurations and combinations of cooling fans to cool the sleds 105a-n, 115a-n and other components housed within chassis 100.

The sleds 105a-n, 115a-n may be individually coupled to chassis 100 via connectors that correspond to connectors provided by front-facing bays of the chassis 100, where these connectors physically and electrically couple an individual sled to a backplane 160 of the chassis, where the backplane may be additionally or alternatively be referred to as a midplane. Chassis backplane 160 may be a printed circuit board that includes electrical traces and connectors that are configured to route signals between components of chassis 100 that are connected to the backplane 160. In various embodiments, backplane 160 may include various additional components, such as cables, wires, connectors, expansion slots, and multiplexers. In certain embodiments, backplane 160 may be a motherboard that includes various electronic components installed thereon. Such components installed on a motherboard backplane 160 may include components that implement all or part of the functions described with regard to the SAS (Serial Attached SCSI) expander 150, I/O controllers 145, network controller 140 and power supply unit 135.

Figure 2:
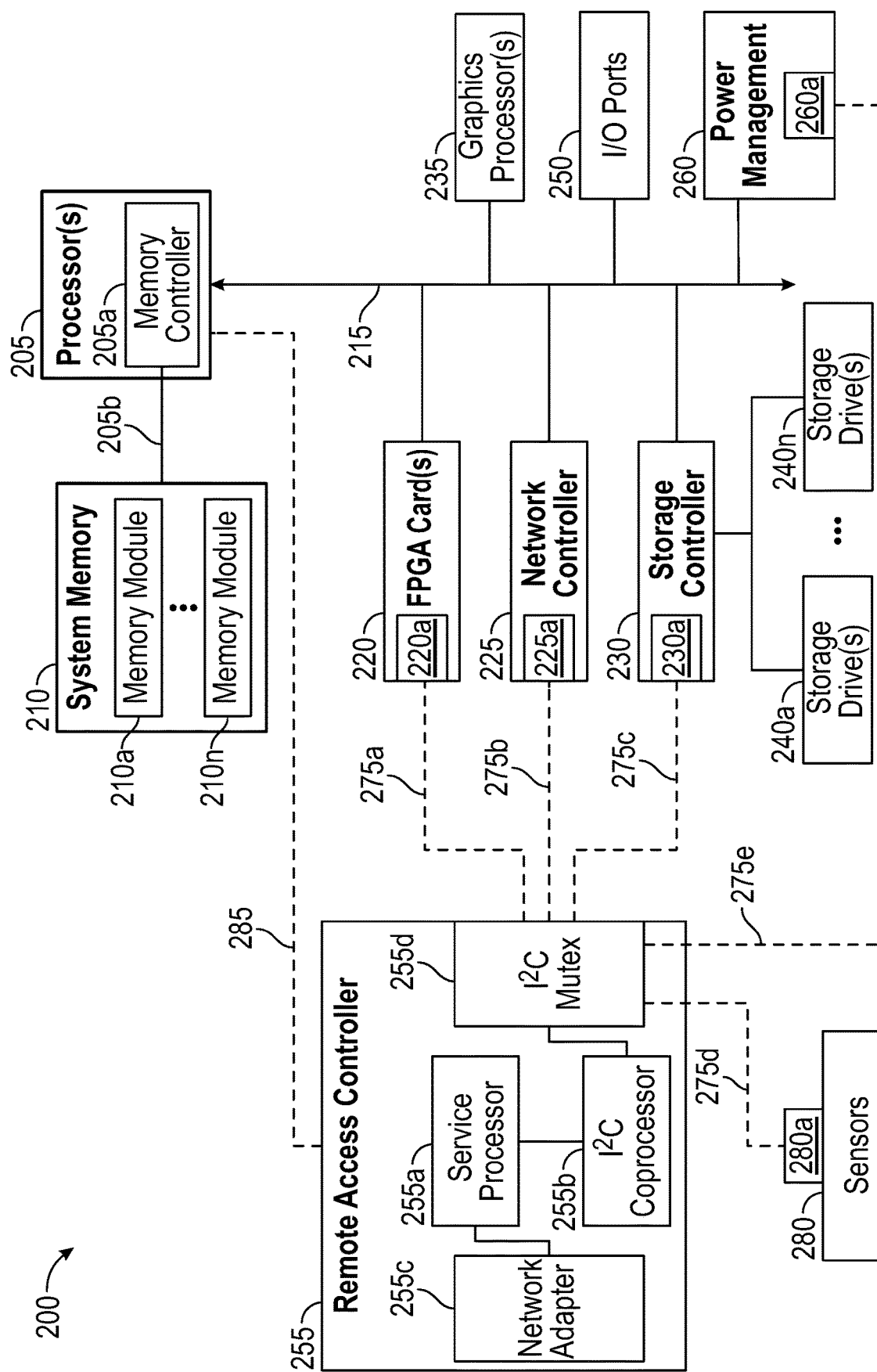
FIG. 2 is a diagram illustrating certain components of an IHS configured as a component of chassis, according to some embodiments, for event-based generation of context-aware telemetry reports.

In certain embodiments, a compute sled 105a-n may be an IHS such as described with regard to IHS 200 of FIG. 2. A compute sled 105a-n may provide computational processing resources that may be used to support a variety of e-commerce, multimedia, business and scientific computing applications, such as services provided via a cloud implementation. Compute sleds 105a-n are typically configured with hardware and software that provide leading-edge computational capabilities. Accordingly, services provided using such computing capabilities are typically provided as high-availability systems that operate with minimum downtime. As described in additional detail with regard to FIG. 2, compute sleds 105a-n may be configured for general-purpose computing or may be optimized for specific computing tasks.

As illustrated, each compute sled 105a-n includes a remote access controller (RAC) 110a-n. As described in additional detail with regard to FIG. 2, each remote access controller 110a-n provides capabilities for remote monitoring and management of compute sled 105a-n. In support of these monitoring and management functions, remote access controllers 110a-n may utilize both in-band and sideband (i.e., out-of-band) communications with various components of a compute sled 105a-n and chassis 100. As illustrated, each compute sled 105a-n may include one or more sensors 160*a-n*. As described in additional detail below, the sensors 160*a-n* may generate various types of metric data that characterize aspects of the operation of a respective compute sled 105*a-n*. For instance, sensors 160*a-n* may collect metric data characterizing the performance of processing, networking, power and/or memory components of a compute sled 105*a-n*, as well as monitoring environmental properties, such as compute sled temperatures. Using collected metric data, each remote access controller 110*a-n* may implement various monitoring and administrative functions related to compute sleds 105*a-n*. Metric data received from these components may also be stored for further analysis, in some instances by the remote access controllers 110*a-n*. As described in additional detail below, the remote access controller may report selected of the stored metric data in response to detected events, such as error conditions, where the metric data that is reported is particularized to the context in which the event occurred.

Each of the compute sleds 105*a-n* includes a storage controller 135*a-n* that may be utilized to access storage drives that are accessible via chassis 100. Some of the individual storage controllers 135*a-n* may provide support for RAID (Redundant Array of Independent Disks) configurations of logical and physical storage drives, such as storage drives provided by storage sleds 115*a-n*. In some embodiments, some or all of the individual storage controllers 135*a-n* may be HBAs (Host Bus Adapters) that provide more limited capabilities in accessing physical storage drives provided via storage sleds 115*a-n* and/or via SAS expander 150.

As illustrated, chassis 100 also includes one or more storage sleds 115*a-n* that are coupled to the backplane 160 and installed within one or more bays of chassis 200 in a similar manner to compute sleds 105*a-n*. Each of the individual storage sleds 115*a-n* may include various different numbers and types of storage devices. For instance, storage sleds 115*a-n* may include SAS (Serial Attached SCSI) magnetic disk drives, SATA (Serial Advanced Technology Attachment) magnetic disk drives, solid-state drives (SSDs) and other types of storage drives in various combinations. The storage sleds 115*a-n* may be utilized in various storage configurations by the compute sleds 105*a-n* that are coupled to chassis 100. As illustrated, each storage sled 115*a-n* may include one or more sensors 165*a-n*. The sensors 165*a-n* may generate various types of metric data that characterize aspects of the operation of a respective storage sled 115*a-n*. For instance, sensors 165*a-n* may collect metric data characterizing the performance of a storage sled 115*a-n*, such as data transfer rates and hard disk drive RPMs, as well as monitoring environmental properties, such as storage sled temperatures. As illustrated, each storage sleds 115*a-n* includes a remote access controller (RAC) 120*a-n*. As described in additional detail below, storage sleds 105*a-n*, or a storage controller 135*a-n* that manages access to storage sleds 105*a-n*, may be configured to generate and report this metric data to the remote access controller 120*a-n*, which may analyze and store the metric data. As described in additional detail below, the remote access controller 120*a-n* may report selected of the stored metric data in response to detected events, such as error conditions, where the metric data that is reported is particularized to the context in which the event occurred.

In addition to the data storage capabilities provided by storage sleds 115*a-n*, chassis 100 may provide access to other storage resources that may be installed components of chassis 100 and/or may be installed elsewhere within a rack housing the chassis 100, such as within a storage blade. In certain scenarios, such storage resources 155 may be accessed via a SAS expander 150 that is coupled to the backplane 160 of the chassis 100. The SAS expander 150 may support connections to a number of JBOD (Just a Bunch Of Disks) storage drives 155 that may be configured and managed individually and without implementing data redundancy across the various drives 155. The additional storage resources 155 may also be at various other locations within a datacenter in which chassis 100 is installed. Such additional storage resources 155 may also be remotely located.

As illustrated, the chassis 100 of FIG. 1 includes a network controller 140 that provides network access to the sleds 105*a-n*, 115*a-n* installed within the chassis. Network controller 140 may include various switches, adapters, controllers and couplings used to connect chassis 100 to a network, either directly or via additional networking components and connections provided via a rack in which chassis 100 is installed. As with compute sleds 105*a-n* and storage sleds 115*a-n*, network controller 140 may include one or more sensors 140*a* that may include physical sensors, such as a temperature sensor providing thermal metrics, and logical sensors, such as capabilities reporting metrics of input and output data transfer rates. As with the sensors of compute sleds 105*a-n* and storage sleds 115*a-n*, the sensors 140*a* of network controller 140 may be configured to generate and report this sensor metric data. As described in additional detail below, upon being stored, a portion of the collected network controller 140 metric data may be provided in response to detected events, such as error conditions, where the metric data that is provided is particularized to the context in which the event occurred.

Chassis 100 may similarly include a power supply unit 135 that provides the components of the chassis with various levels of DC power from an AC power source or from power delivered via a power system provided by a rack within which chassis 100 may be installed. In certain embodiments, power supply unit 135 may be implemented within a sled that provides chassis 100 with redundant, hot-swappable power supply units. As illustrated, power supply unit 135 may include one or more sensors 135*a* that may include physical sensors, such as a temperature sensor providing thermal and power output metrics, and logical sensors, such as capabilities that report discrete power settings. As above, the sensors 135*a* of power supply unit 135 may be configured to generate and report metric data. As described in additional detail below, upon being stored, a portion of the collected power supply unit 135 metric data may be provided in response to detected events, such as error conditions, where the metric data that is provided is particularized to the context in which the event occurred.

Chassis 100 may also include various I/O controllers 140 that may support various I/O ports, such as USB ports that may be used to support keyboard and mouse inputs and/or video display capabilities. Such I/O controllers 145 may be utilized by a chassis management controller 125 to support various KVM (Keyboard, Video and Mouse) 125*a* capabilities that provide administrators with the ability to interface with the chassis 100. In addition to providing support for KVM 125*a* capabilities for administering chassis 100, chassis management controller 125 may support various additional functions for sharing the infrastructure resources of chassis 100. In some scenarios, chassis management controller 125 may implement tools for managing the power 135, network bandwidth 140 and airflow cooling 130 that are available via the chassis 100. As described, the airflow cooling 130 utilized by chassis 100 may include an airflow cooling system that is provided by a rack in which the chassis 100 may be installed and managed by a cooling module 125b of the chassis management controller 125. In some embodiments, the operations of a chassis management controller 125 may be implemented by one of the compute sled or storage sled remote access controllers 110a-n, 120a-n that has been designated and configured for managing chassis-level configurations. In some embodiments, chassis management controller 125 may receive metric reports from one or more sensors 170 that are components of chassis 100, such as temperature sensors at various chassis locations that provide inlet and exhaust temperature measurements. In such embodiments, such chassis sensors 170 be configured to generate and report metric data. As described in additional detail below, upon being stored, a portion of the collected chassis metric data may be provided in response to detected events, such as error conditions, where the metric data that is provided is particularized to the context in which the event occurred.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIG. 2 shows an example of an IHS 200 configured to implement systems and methods described herein for event-based generation of context-aware telemetry reports. It should be appreciated that although the embodiments described herein may describe an IHS that is a compute sled, server or similar computing component that may be deployed within a rack-mounted chassis, other embodiments may be utilized with other types of IHSs. In the illustrative embodiment of FIG. 2, IHS 200 may be a computing component, such as compute sled 105a-n, that is configured to share infrastructure resources provided by a chassis 100. In some embodiments, IHS 200 may be a server, such as a 1RU (Rack Unit) server, that is installed within a slot of a chassis, such as a 2RU chassis, with another 1RU IHS server installed in the other slot of the chassis.

The IHS 200 of FIG. 2 may be a compute sled, such as compute sleds 105a-n of FIG. 1, that may be installed within a chassis, that may in turn be installed within a rack. Installed in this manner, IHS 200 may utilized shared power, network and cooling resources provided by the chassis and/or rack. IHS 200 may utilize one or more processors 205. In some embodiments, processors 205 may include a main processor and a co-processor, each of which may include a plurality of processing cores that, in certain scenarios, may be used in operating multiple virtualized computing environments. In certain embodiments, one or all of processor(s) 205 may be graphics processing units (GPUs) in scenarios where IHS 200 has been configured to support functions such as multimedia services and graphics applications.

In some embodiments, processor 205 may be configured to operate as a source of metric data providing physical sensor data, such as junction temperatures and power consumption. Processor 205 may also be configured to operate as a source logical sensor data, such as remaining CPU processing capacity. In some embodiments, processor 205 may be configured by remote access controller 255 to generate metrics that are reported to the remote access controller, where the configuration and reporting of this metric data may be via a PECI (Platform Environment Control Interface) bus 285 operations. Processor 205 may be configured to generate and report such metric data to remote access controller 255 for analysis and storage. As described in additional detail below, upon being stored, a portion of the collected metric data may be provided in response to detected events, such as error conditions, where the metric data that is provided is particularized to the context in which the event occurred.

As illustrated, processor(s) 205 includes an integrated memory controller 205a that may be implemented directly within the circuitry of the processor 205, or the memory controller 205a may be a separate integrated circuit that is located on the same die as the processor 205. The memory controller 205a may be configured to manage the transfer of data to and from the system memory 210 of the IHS 200 via a high-speed memory interface 205b. In some embodiments, memory controller 205a may be configured to operate as a source of metric data capable of generating metric reports that are reported to remote access controller 255. The metric data reported by memory controller 205a may include metrics such as the amount of available system memory 210 and memory transfer rates via memory interface 205b. The metric reporting capabilities of memory controller 205a may be configured to generate and report such metric data, to remote access controller 255 for analysis and storage. As described in additional detail below, upon being stored, a portion of the collected metric data may be provided in response to detected events, such as error conditions, where the metric data that is provided is particularized to the context in which the event occurred.

The system memory 210 is coupled to processor(s) 205 via a memory bus 205b that provides the processor(s) 205 with high-speed memory used in the execution of computer program instructions by the processor(s) 205. Accordingly, system memory 210 may include memory components, such as such as static RAM (SRAM), dynamic RAM (DRAM), NAND Flash memory, suitable for supporting high-speed memory operations by the processor(s) 205. In certain embodiments, system memory 210 may combine both persistent, non-volatile memory and volatile memory. In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket that receives a specific type of removable memory module 210a-n, such as a DIMM (Dual In-line Memory Module), that can be coupled to the socket and then decoupled from the socket as needed, such as to upgrade memory capabilities or to replace faulty components. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each processor 205. All or portions of the chipset may be implemented directly within the integrated circuitry of an individual processor 205. The chipset may provide the processor(s) 205 with access to a variety of resources accessible via one or more buses 215. Various embodiments may utilize any number of buses to provide the illustrated pathways served by bus 215. In certain embodiments, bus 215 may include a PCIe (PCI Express) switch fabric that is accessed via a PCIe root complex. IHS 200 may also include one or more I/O ports 250, such as PCIe ports, that may be used to couple the IHS 200 directly to other IHSs, storage resources or other peripheral components.

In certain embodiments, a graphics processor 235 may be comprised within one or more video or graphics cards, or an embedded controller, installed as components of the IHS 200. In certain embodiments, graphics processor 235 may be an integrated of the remote access controller 255 and may be utilized to support the display of diagnostic and administrative interfaces related to IHS 200 via display devices that are coupled, either directly or remotely, to remote access controller 255.

In the illustrated embodiments, processor(s) 205 is coupled to a network controller 225, such as provided by a Network Interface Controller (NIC) that is coupled to the IHS 200 and allows the IHS 200 to communicate via an external network, such as the Internet or a LAN. As illustrated, network controller 225 may be instrumented with a controller or other logic unit 225a that supports a sideband management connection 275b with remote access controller 255. Via the sideband management connection 275b, network controller 225 may be configured to operate as a source of metric data that may include environmental metrics, such as a temperature measurements, and logical sensors, such as metrics reporting input and output data transfer rates. Network controller 225 may be configured to generate and report such metric data to remote access controller 255 for analysis and storage. As described in additional detail below, upon being stored, a portion of the collected metric data may be provided in response to detected events, such as error conditions, where the metric data that is provided is particularized to the context in which the event occurred.

Processor(s) 205 may also be coupled to a power management unit 260 that may interface with the power system unit 135 of the chassis 100 in which IHS 200 may be installed. As with network controller 225, power management unit 260 may be instrumented with a controller or other logic unit 260a that supports a sideband management connection 275e with remote access controller 255. Via the sideband management connection 275e, power management unit 255 may be configured to operate as a source of metric data that may include physical sensors, such as a sensors providing temperature measurements and sensors providing power output measurements, and logical sensors, such as capabilities reporting discrete power settings. Power management unit 255 may be configured to generate and report such metric data to remote access controller 255 for analysis and storage. As described in additional detail below, upon being stored, a portion of the collected metric data may be provided in response to detected events, such as error conditions, where the metric data that is provided is particularized to the context in which the event occurred.

As illustrated, IHS 200 may include one or more FPGA (Field-Programmable Gate Array) card(s) 220. Each FPGA card 220 supported by IHS 200 may include various processing and memory resources, in addition to an FPGA integrated circuit that may be reconfigured after deployment of IHS 200 through programming functions supported by the FPGA card 220. FGPA card 220 may be optimized to perform specific processing tasks, such as specific signal processing, security, data mining, and artificial intelligence functions, and/or to support specific hardware coupled to IHS 200. FPGA card 220 may include one or more physical and/or logical sensors. As specialized computing components, FPGA cards may be used to support large-scale computational tasks that may result in the FPGA card 220 generating significant amounts of heat. In order to protect specialized FPGA cards from damaging levels of heat, FPGA card 220 may be outfitted with multiple temperature sensors. FPGA card 220 may also include logical sensors that are sources of metric data, such as metrics reporting numbers of calculations performed by the programmed circuitry of the FPGA. The FPGA card 220 may also include a management controller 220a that may support interoperation was the remote access controller 255 via a sideband device management bus 275a. The management controller 220a of FPGA card 220 may be configured to generate and report metric data to remote access controller 255 for analysis and storage. As described in additional detail below, upon being stored, a portion of the collected metric data may be provided in response to detected events, such as error conditions, where the metric data that is provided is particularized to the context in which the event occurred.

In certain embodiments, IHS 200 may operate using a BIOS (Basic Input/Output System) that may be stored in a non-volatile memory accessible by the processor(s) 205. The BIOS may provide an abstraction layer by which the operating system of the IHS 200 interfaces with the hardware components of the IHS. Upon powering or restarting IHS 200, processor(s) 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for use by the IHS 200. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 255.

IHS 200 may include one or more storage controllers 230 that may be utilized to access storage drives 240a-n that are accessible via the chassis in which IHS 100 is installed. Storage controller 230 may provide support for RAID (Redundant Array of Independent Disks) configurations of logical and physical storage drives 240a-n. In some embodiments, storage controller 230 may be an HBA (Host Bus Adapter) that provides more limited capabilities in accessing physical storage drives 240a-n. In some embodiments, storage drives 240a-n may be replaceable, hot-swappable storage devices that are installed within bays provided by the chassis in which IHS 200 is installed. In some embodiments, storage drives 240a-n may also be accessed by other IHSs that are also installed within the same chassis as IHS 100. In embodiments where storage drives 240a-n are hot-swappable devices that are received by bays of chassis, the storage drives 240a-n may be coupled to IHS 200 via couplings between the bays of the chassis and a midplane of IHS 200. Storage drives 240a-n may include SAS (Serial Attached SCSI) magnetic disk drives, SATA (Serial Advanced Technology Attachment) magnetic disk drives, solid-state drives (SSDs) and other types of storage drives in various combinations.

As illustrated, storage controller 230 may be instrumented with a controller or other logic unit 230a that supports a sideband management connection 275c with remote access controller 255. Via the sideband management connection 275c, storage controller 230 may be configured to operate as a source of metric data regarding the operation of storage drives 240a-n. For instance, controller 230a may collect metric data characterizing the performance of individual storage drives 240a-n, such as available storage capacity and data transfer rates, as well as environmental properties, such as storage drive temperatures. A controller or other logic unit 230a of storage controller 230 may be configured to generate and report such metric data to remote access controller 255 for analysis and storage. As described in additional detail below, upon being stored, a portion of the collected metric data may be provided in response to detected events, such as error conditions, where the metric data that is provided is particularized to the context in which the event occurred.

In certain embodiments, remote access controller 255 may operate from a different power plane from the processors 205 and other components of IHS 200, thus allowing the remote access controller 255 to operate, and management tasks to proceed, while the processing cores of IHS 200 are powered off. As described, various functions provided by the BIOS, including launching the operating system of the IHS 200, may be implemented by the remote access controller 255. In some embodiments, the remote access controller 255 may perform various functions to verify the integrity of the IHS 200 and its hardware components prior to initialization of the IHS 200 (i.e., in a bare-metal state).

In some embodiments, remote access controller 255 may also be directly coupled via I2C couplings 275d with one or more sensors 280, such as sensors that provide measurements of ambient inlet temperatures, outlet airflow temperatures and temperatures at various locations within IHS 200. Sensors 280 coupled directly to remote access controller 255 may also be used in implementing security protocols, such as intrusion detection sensors and user proximity sensors. Sensors 280 may include logic units or other controllers 280a that are be configured by remote access controller 255 to generate and report metric data, where the generated metric data may be utilized by remote access controller 255 in providing metric data in response to detected events, such as error conditions, where the metric data that is provided is particularized to the context in which the event occurred.

Remote access controller 255 may include a service processor 255a, or specialized microcontroller, that operates management software that supports remote monitoring and administration of IHS 200. Remote access controller 255 may be installed on the motherboard of IHS 200 or may be coupled to IHS 200 via an expansion slot provided by the motherboard. In support of remote monitoring functions, network adapter 225c may support connections with remote access controller 255 using wired and/or wireless network connections via a variety of network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 255 may support monitoring and administration of various managed devices 220, 225, 230, 260, 280 of an IHS via a sideband bus interface. For instance, messages utilized in device management may be transmitted using I2C sideband bus connections 275a-e that may be individually established with each of the respective managed devices 220, 225, 230, 260, 280 through the operation of an I2C multiplexer 255d of the remote access controller. As illustrated, certain of the managed devices of IHS 200, such as FPGA cards 220, network controller 225, storage controller 230 and power management unit 260, are coupled to the IHS processor(s) 205 via an in-line bus 215, such as a PCIe root complex, that is separate from the I2C sideband bus connections 275a-e used for device management.

In certain embodiments, the service processor 255a of remote access controller 255 may rely on an I2C co-processor 255b to implement sideband I2C communications between the remote access controller 255 and managed components 220, 225, 230, 260, 280 of the IHS. The I2C co-processor 255b may be a specialized co-processor or micro-controller that is configured to interface via a sideband I2C bus interface with the managed hardware components 220, 225, 230, 260, 280 of IHS. In some embodiments, the I2C co-processor 255b may be an integrated component of the service processor 255a, such as a peripheral system-on-chip feature that may be provided by the service processor 255a. Each I2C bus 275a-e is illustrated as single line in FIG. 2. However, each I2C bus 275a-e may be comprised of a clock line and data line that couple the remote access controller 255 to I2C endpoints 220a, 225a, 230a, 260a, 280a on each of the managed components.

As illustrated, the I2C co-processor 255b may interface with the individual managed devices 220, 225, 230, 260, 280 via individual sideband I2C buses 275a-e selected through the operation of an I2C multiplexer 255d. Via switching operations by the I2C multiplexer 255d, a sideband bus connection 275a-e may be established by a direct coupling between the I2C co-processor 255b and an individual managed device 220, 225, 230, 260, 280. In providing sideband management capabilities, the I2C co-processor 255b may each interoperate with corresponding endpoint I2C controllers 220a, 225a, 230a, 260a, 280a that implement the I2C communications of the respective managed devices 220, 225, 230, 260, 280. The endpoint I2C controllers 220a, 225a, 230a, 260a, 280a may be implemented as dedicated microcontrollers for communicating sideband I2C messages with the remote access controller 255, or endpoint I2C controllers 220a, 225a, 230a, 260a, 280a may be integrated SoC functions of a processor of the respective managed device endpoints 220, 225, 230, 260, 280.

In some embodiments, remote access controller 255 may utilizes sideband management connections 275a-e in detecting various type of events, such as error conditions. For instance, remote access controller 255 may detect error condition signals transmitted by managed devices 220, 225, 230, 260, 280 via the sideband connections 275a-e. In other instances, remote access controller 255 may determine error conditions or other events by based on queries transmitted to managed devices 220, 225, 230, 260, 280 via the sideband connections 275a-e. In some embodiments, remote access controller 255 may also receive event notifications from the operating system of IHS 200. Event notifications may also be received by remote access controller 255 from other components that are installed within the same chassis as IHS 200. In some embodiments, IHS events may be determined by remote access controller 255 based on metric reports received from components of the described telemetry system.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
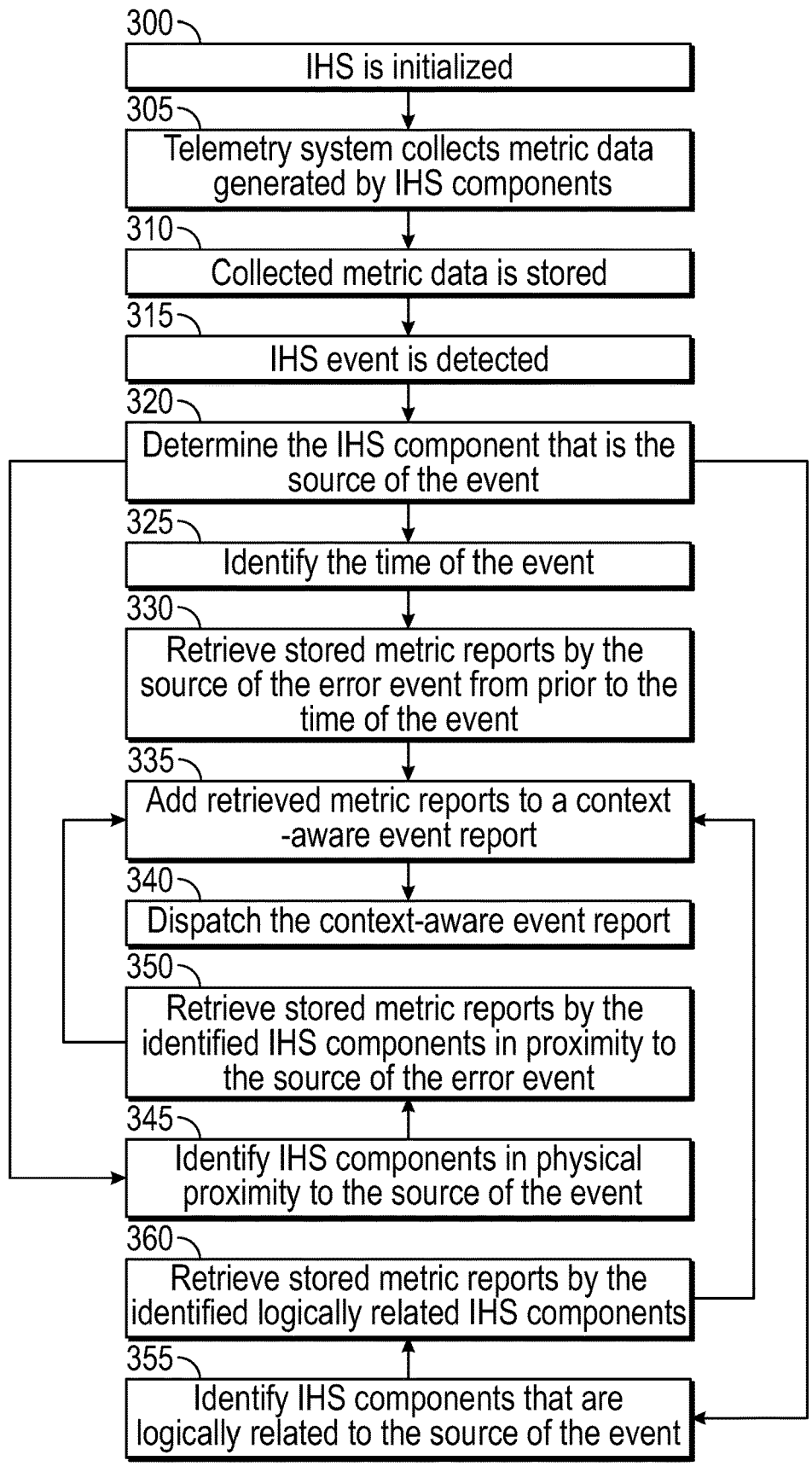
FIG. 3 is a flowchart describing certain steps of a method, according to some embodiments, for event-based generation of context-aware telemetry reports.

FIG. 3 is a flowchart describing certain steps of a method, according to some embodiments, for event-based generation of context-aware telemetry reports. Embodiments may begin at block 300 with the initialization of an IHS, such as the IHSs described with regard to FIGS. 1 and 2. Upon being initialized, a wide variety of metric data may be collected by the telemetry system of an IHS. As described, various components of an IHS may be instrumented with physical and/or logical sensors that characterize various aspects of the operation of the IHS. In some embodiments, a remote access controller of the IHS may receive metric data reported by the components of the IHS. Upon receipt of these metric reports, the remote access controller may evaluate some or all of the reports in order to identify conditions that warrant an immediate response. For instance, the remote access controller may evaluate reported temperature information in order to immediately identify scenarios were thermal thresholds for safe operation have been exceeded. In addition, at block 310, the remote access controller may store all or part of received metric reports to a database, or to one or more logs, for use in supporting additional analysis and troubleshooting of IHS operations.

With the IHS telemetry data being collected and preserved in this manner, at block 315, an event of interest may be detected. In some instances, such events may be error conditions that result from component failures or malfunctions that render the component inoperable. For example, a memory module may become entirely nonresponsive as a result of a malfunction. In other scenarios, a component be rendered inoperable, but may still respond to queries with an error code or other indication of an error condition. In other instances, a supervisory component may report a failure by a supported component. For example, a storage controller may report a failure by a storage drive that is managed by the storage controller. In other instances, such events may be conditions reported by a component itself, where the component provides indication the it is not functioning properly, but nonetheless remains at least partially operable. For example, a fan sensor may report metric data indicating the fan is rotating at reduced RPMs, but it does continue to operate. In some instances, the event may be an exception generated by a software program, where such software programs may operate on a specific component, such as a RAID application operated by a storage controller, or may be operated by the operating system of an IHS. In other scenarios, rather than reporting an error condition, the event may reflect a warning or other condition of interest, such as temperature measurements exceeding a predefined threshold. In other scenarios, IHS events may be related to security protocols implemented by the IHS. For instance, a memory module may report attempts to access a secured memory partition that is used to store cryptographic information.

In some embodiments, the remote access controller may implement procedures for detecting such types of IHS events. In some instances, the remote access controller may detect events directly, such as via error conditions detected on sideband signaling pathways used to communicate with managed components of the IHS, such as described with regard to FIG. 2. In other instances, the IHS events may be reported to the remote access controller, where the events may be reported by the operating system, a supervisory component, an external system and/or the component that is experiencing the failure or other condition. At block 320, the remote access controller determines the component of the IHS that is the source of the event. In some instances, the source of the event may be evident where the component itself is reporting the event. In other instances, the remote access controller may parse an event notification in order to determine the source of the event. In some embodiments, the remote access controller may maintain a device descriptor table that specifies the components that are compatible for operation on the IHS. In such embodiments, the remote access controller may utilize this device descriptor table in order to map the source of an event to a particular component. Using this mapping, the remote access controller may associate the component that is the source of the event to one or more sources of telemetry data that describe the operation of that component.

With the component that is the source of the event identified, the remote access controller may commence collecting metric data that provides context for the event. At block 325, the remote access controller may determine the time of the event. In some instances, the time of the event may be included in the report providing notification of the event. In other instances, the remote access controller may determine this time based on its own detection of the event, such as based on error conditions detected on sideband management buses.

As described, metric reports received by the telemetry system of an IHS may be stored to a database or otherwise logged. Based on this identified time of the event, at block 330, the remote access controller retrieves metric reports generated by the source of the event, where the retrieved metric reports are from prior to the time of the event. For example, if a storage controller reports an error in a managed storage drive at a specific time, the remote access controller may retrieve metric reports by that particular drive that were generated within a one minute interval prior to that time of the reported error. In some embodiments, the length of this interval may be configurable based on user inputs. In some embodiments, the length of this interval may be selected by the remote access controller based on the number of identified metric reports that fall within the interval. For example, if no metric reports from the storage drive are found within the one minute interval prior to the error, the remote access controller may search for metric reports from this storage drive within a five minute interval prior to the time of the error. Conversely, if fifty metric reports from the storage drive are found within the one minute interval, the remote access controller may instead reduce the interval to thirty seconds prior to the time of the error.

As illustrated in FIG. 3, upon determining the component that is the source of an event, at block 345, the remote access controller may identify components that are in physical proximity to the source of the event. For instance, in a scenario where the source of an event is a storage drive installed in one of the bays of a chassis, the remote access controller may identify storage drives that are installed in adjacent bays. In some embodiments, the remote access controller may utilize a device descriptor table in identifying components that are in physical proximity to the source of an event. For instance, if the source of the event is a storage drive installed in bay number five of a server, the remote access controller may utilize the device descriptor table to identify storage drives in adjacent bays by identifying the storage drives in bays numbered one greater and one less than bay number five. The storage controller may similarly identify components in physical proximity to the source of an event based on the installed location of components within sets of slots or connectors that are individually numbered. For instance, if the source of an event is a device installed in the third PCIe slot of an IHS, the storage controller may identify the devices installed in the second and fourth PCIe slots of the IHS as being in physical proximity to the device in the third PCIe slot.

At block 350, the remote access controller retrieves metric reports generated by these components determined to be in physical proximity to the source of the event. In some instances, the remote access controller may retrieve the most recent metric reports by these components. Alternatively or additionally, the remote access controller may retrieve metric reports that were generated by these components near the time of the reported event. For instance, the remote access controller may retrieve metric reports generated by these components within a one minute interval prior to the event and within a one minute interval after the event. As above, the length of these intervals may be configurable based on user input or may be configured by the remote access controller based on the number of metric reports that are identified within these intervals.

In addition to identifying components that are in physical proximity to the source of an event, at block 355, the remote access controller may also identify components that are logically related to the source of the event. For example, if the source of an event is a storage drive, the remote access controller may identify a storage controller that manages the storage drive as a logically related component. Similarly, if the source of event is a memory module, the remote access controller may identify the memory controller that manages this memory module as a logically related component. In an IHS that includes redundant components, the remote access controller may identify logically related components based on any redundancy. For example, in an IHS that includes two power supply units, if the source of an event is one power supply unit, the remote access controller may identify the other power supply unit as a logically related component. At block 360, the remote access controller retrieves metric reports generated by these logically related components. As above, the most current metric reports may be retrieved, or metric reports may be retrieved that were generated within a configurable interval of the time of the event, such as within one minute prior to and after the time of the event.

As illustrated, at block 335, the remote access controller includes the metric reports that were collected from the logically related components, from the physically related components and from the component that is the source of the event within a context aware event report. At block 340, the remote access controller dispatches this context aware event report to an administrative application, and/or stores the report for later analysis. In this manner, embodiments provide administrators with metric information related to a detected event, such as an error condition, where the provided metric information is particularized to the context of the event. Accordingly, when attempting to diagnose an event such as an error condition, the reporting of the event may be provided with context information that can greatly aid an administrator in diagnosing and correcting the issue. In existing systems, administrators are provided with notification of errors, but are left with considerable work in determining the context in which this error occurred.

In some embodiments, context aware metric reports may be utilized to implement capabilities for predicting events such as error conditions. Existing capabilities may seek to predict error conditions based on analysis of a single stream of metric data, such as metric data generated by a fan controller that could be used to predict fan failures based on identified patterns in fan RPMs that precede a fan failure. Using the described embodiments, prediction capabilities may be implemented using the context aware metric reports that identify metric data patterns that span multiple components. For instance, using a context aware metric report that includes metric reports from a storage drive from prior to an error condition in that storage drive, metric reports from neighboring storage drives and metric reports from a storage controller managing the storage drive with the error condition, robust prediction capabilities may be implemented that can predict the storage drive error condition when monitored metric data reports indicate that this particular context aware metric report will be repeated. By utilizing metric data from multiple components, more complex prediction capabilities may be implemented in comparison to predictions based on a single stream of metric data.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An IHS (Information Handling System) comprising:
a plurality of sources of metric data;
one or more main processors;
a system memory storing program instructions for executing an operating system by the one or more processors; and
a remote access controller providing remote management of the IHS, wherein the remote access controller provides remote management of the IHS separate from the operating system of the IHS that is executed by the one or more main processors of the IHS, and wherein the remote access controller is configured to:
store metric reports received from the plurality of metric data sources, wherein at least a portion of the metric reports are received from sideband management connections between the remote access controller and the plurality of sources of metric data;
receive an indication of an IHS event, wherein the indication specifies a first component of the IHS as a source of the event and wherein the indication specifies a first time at which the event occurred;
identify a first plurality of the stored metric reports generated by the first component of the IHS prior to the first time at which the event occurred;
identify a second plurality of stored metric reports generated by components of the IHS that are logically or physically related to the first component of the IHS; and
generate an event report comprising the first plurality of the metric reports generated by the first component of the IHS prior to the first time at which the event occurred and the second plurality of metric reports generated by components of the IHS that are logically or physically related to the first component of the IHS.

2. The IHS of claim 1, wherein the components of the IHS related to the first component of the IHS are determined based on physical proximity to the first component of the IHS.

3. The IHS of claim 2, wherein the physical proximity of the related components of the IHS is determined based on a proximity of the related components from a coupling of the first component to the IHS.

4. The IHS of claim 2, wherein the components of the IHS related to the first component are located in bays of the IHS that are physically adjacent to a bay in which the first component is located.

5. The IHS of claim 2, wherein the first component is coupled to the IHS via a first connector and wherein the components related to the first component of the IHS are coupled to the IHS via connectors that are physically adjacent to the first connector.

6. The IHS of claim 1, wherein the IHS event is an error condition reported by the first component of the IHS.

7. The IHS of claim 1, wherein the components of the IHS that are related to the first component of the IHS are determined based on a logical management relationship by the remote access controller.

8. The IHS of claim 7, wherein the logical relationship comprises management of the first component of the IHS by the remote access controller via the related components.

9. The IHS of claim 1, wherein the plurality of metric reports generated by the first component of the IHS prior to the first time at which the event occurred are generated within a predefined interval prior to the first time at which the event occurred.

10. A method for providing diagnostic IHS (Information Handling System) telemetry by a remote access controller of the IHS that provides remote management of the IHS separate from operating systems of the IHS that are executed by one or more main processors of the IHS, the method comprising:
storing metric reports received from a plurality of components of the IHS, wherein at least a portion of the metric reports are received from sideband management connections between the remote access controller and the plurality of components of the IHS;
receiving an indication of an IHS event;
identifying a first component of the IHS as a source of the event and a first time at which the event occurred;
identifying a plurality of the stored metric reports generated by the first component of the IHS prior to the first time at which the event occurred;
identifying a plurality of the stored metric reports generated by components of the IHS that are logically or physically related to the first component of the IHS; and
generating an event report comprising the plurality of the metric reports generated by the first component of the IHS prior to the first time at which the event occurred and the plurality of metric reports generated by components related to the first component.

11. The method of claim 10, wherein the components of the IHS related to the first component of the IHS are determined based on a physical proximity to the first component.

12. The method of claim 11, wherein the first component of the IHS is coupled to the IHS via a first connector and wherein the components related to the first component of the IHS are physically coupled to connectors of the IHS that are adjacent to the first connector.

13. The method of claim 10, wherein the IHS event is an error condition reported by the first component of the IHS.

14. The method of claim 10, wherein the components related to the first component of the IHS are determined based on a logical management relationship by the remote access controller.

15. The method of claim 14, wherein the logical relationship comprises management of the first component by the remote access controller via the related components.

16. The method of claim 10, wherein the plurality of metric reports generated by the first component prior to the first time are generated within a predefined interval prior to the first time at which the event occurred.

17. A remote access controller providing diagnostic IHS (Information Handling System) telemetry, wherein the remote access controller provides remote management of the IHS separate from operating systems of the IHS that are executed by one or more main processors of the IHS; the remote access controller comprising:
one or more processors; and
a memory device coupled to the one or more processors of the remote access controller, the memory device storing computer-readable instructions that, upon execution by the one or more processors of the remote access controller, cause the remote access controller to:
store metric reports received from a plurality of components of the IHS, wherein at least a portion of the metric reports are received from sideband management connections between the remote access controller and the plurality of components of the IHS;

receive an indication of an IHS event, wherein the indication specifies a first component of the IHS as a source of the event and wherein the indication specifies a first time at which the event occurred;

identify a plurality of the metric reports generated by the first component of the IHS prior to the first time at which the event occurred;

identify a plurality of metric reports generated by components logically or physically related to the first component of the IHS; and generate an event report comprising the plurality of the metric reports generated by the first component of the IHS prior to the first time at which the event occurred and the plurality of metric reports generated by components related to the first component of the IHS.

18. The remote access controller of claim 17, wherein the components of the IHS related to the first component of the IHS are determined based on a physical proximity to the first component of the IHS.

19. The remote access controller of claim 17, wherein the components related to the first component of the IHS are determined based on a logical management relationship by the remote access controller.

20. The remote access controller of claim 17, wherein the IHS event is an error condition reported by the first component of the IHS.

* * * * *